United States Patent
Chern

(10) Patent No.: US 11,152,381 B1
(45) Date of Patent: Oct. 19, 2021

(54) MOS TRANSISTOR HAVING LOWER GATE-TO-SOURCE/DRAIN BREAKDOWN VOLTAGE AND ONE-TIME PROGRAMMABLE MEMORY DEVICE USING THE SAME

(71) Applicant: HeFeChip Corporation Limited, Sai Ying Pun (HK)

(72) Inventor: Geeng-Chuan Chern, Cupertino, CA (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 16/846,424

(22) Filed: Apr. 13, 2020

(51) Int. Cl.
| H01L 29/78 | (2006.01) |
| H01L 27/112 | (2006.01) |
| H01L 29/66 | (2006.01) |
| H01L 21/285 | (2006.01) |
| H01L 21/265 | (2006.01) |
| H01L 21/336 | (2006.01) |

(52) U.S. Cl.
CPC .. H01L 27/11206 (2013.01); H01L 21/26513 (2013.01); H01L 21/28518 (2013.01); H01L 29/665 (2013.01); H01L 29/66484 (2013.01); H01L 29/66553 (2013.01)

(58) Field of Classification Search
CPC ..... H01L 21/823462; H01L 21/823857; H01L 27/11206; H01L 21/26513; H01L 21/28518; H01L 29/665; H01L 21/823468; H01L 21/823864; H01L 29/66484; H01L 29/66553; H01K 27/11206

USPC .............. 438/163, 301, 302, 303, 305, 306
See application file for complete search history.

(56) References Cited

U.S. PATENT DOCUMENTS

| 3,423,646 A | 1/1969 | Cubert |
| 3,634,929 A | 1/1972 | Yoshida |
| 4,322,822 A | 3/1982 | McPherson |
| 4,507,757 A | 3/1985 | McElroy |
| 4,682,404 A * | 7/1987 | Miller ................... H01L 21/266 438/306 |
| 4,728,617 A * | 3/1988 | Woo ................... H01L 29/66598 438/305 |
| 4,757,026 A * | 7/1988 | Woo ................ H01L 21/823864 148/DIG. 106 |

(Continued)

FOREIGN PATENT DOCUMENTS

| EP | 3 270 539 A1 | 1/2018 |
| JP | 11274313 | * 10/1999 ..... H01L 21/823462 |

OTHER PUBLICATIONS

Liu et al., "A Gate-Oxide-Breakdown Antifuse OTP ROM Array Based on TSMC 90nm Process", 2015 IEEE, 2015.

(Continued)

*Primary Examiner* — Mary A Wilczewski
(74) *Attorney, Agent, or Firm* — Winston Hsu

(57) ABSTRACT

A MOS transistor includes a semiconductor substrate, a drain region and a source region in the semiconductor substrate, a channel region between the drain region and the source region, a gate electrode on the channel region, and a gate dielectric layer between the gate electrode and the semiconductor substrate. The gate dielectric layer has different thicknesses. The MOS transistor has a gate-to-source/drain breakdown voltage that is lower than a gate-to-channel breakdown voltage and a gated source/drain junction breakdown voltage.

10 Claims, 14 Drawing Sheets

(56) References Cited

U.S. PATENT DOCUMENTS

| | | | |
|---|---|---|---|
| 4,784,965 A * | 11/1988 | Woo | H01L 21/823864 |
| | | | 148/DIG. 106 |
| 4,823,181 A | 4/1989 | Mohsen | |
| 4,855,247 A * | 8/1989 | Ma | H01L 21/0337 |
| | | | 438/305 |
| 4,975,385 A * | 12/1990 | Beinglass | H01L 21/28105 |
| | | | 438/304 |
| 5,019,878 A | 5/1991 | Yang | |
| 5,025,494 A * | 6/1991 | Gill | H01L 27/115 |
| | | | 257/316 |
| 5,314,834 A * | 5/1994 | Mazure | H01L 29/42368 |
| | | | 257/324 |
| 5,672,994 A | 9/1997 | Au | |
| 5,837,588 A * | 11/1998 | Wu | H01L 29/6659 |
| | | | 438/305 |
| 6,010,954 A * | 1/2000 | Ho | H01L 21/28114 |
| | | | 257/344 |
| 6,025,635 A * | 2/2000 | Krivokapic | H01L 21/28114 |
| | | | 257/288 |
| 6,097,070 A * | 8/2000 | Mandelman | H01L 21/28114 |
| | | | 257/333 |
| 6,218,699 B1 * | 4/2001 | Kakoschke | H01L 29/7883 |
| | | | 257/321 |
| 6,225,669 B1 * | 5/2001 | Long | H01L 21/28105 |
| | | | 257/221 |
| 6,258,641 B1 | 7/2001 | Wong | |
| 6,262,451 B1 * | 7/2001 | Huang | H01L 21/2815 |
| | | | 257/295 |
| 6,437,389 B1 * | 8/2002 | Forbes | H01L 27/112 |
| | | | 257/302 |
| 6,580,145 B2 | 6/2003 | Wu | |
| 6,597,234 B2 | 7/2003 | Reber | |
| 6,844,252 B2 * | 1/2005 | Pan | H01L 21/28167 |
| | | | 257/E21.193 |
| 6,888,205 B2 * | 5/2005 | Moscatelli | H01L 21/28167 |
| | | | 257/406 |
| 6,933,554 B1 * | 8/2005 | Han | H01L 21/28194 |
| | | | 257/314 |
| 7,002,219 B1 | 2/2006 | de Jong | |
| 7,102,910 B2 | 9/2006 | Pham | |
| 7,141,862 B2 * | 11/2006 | Noda | H01L 21/823418 |
| | | | 257/500 |
| 7,220,649 B2 * | 5/2007 | Nakamura | H01L 21/823418 |
| | | | 257/E21.619 |
| 7,402,855 B2 | 7/2008 | Kurjanowicz | |
| 8,026,133 B2 * | 9/2011 | Ozawa | H01L 29/42324 |
| | | | 438/197 |
| 8,213,211 B2 | 7/2012 | Kurjanowicz | |
| 8,237,224 B2 * | 8/2012 | Nakamura | H01L 21/823456 |
| | | | 257/344 |
| 8,324,042 B2 * | 12/2012 | Cai | H01L 29/0847 |
| | | | 438/231 |
| 8,471,355 B2 | 6/2013 | Kurjanowicz | |
| 9,281,074 B2 | 3/2016 | Wu | |
| 9,583,612 B1 * | 2/2017 | Edwards | H01L 21/266 |
| 9,741,850 B1 * | 8/2017 | Hsiao | H01L 29/66545 |
| 10,163,783 B1 | 12/2018 | Chang | |
| 10,181,357 B2 | 1/2019 | Wong | |
| 10,276,679 B2 * | 4/2019 | Chiu | H01L 29/66575 |
| 10,361,296 B2 * | 7/2019 | Matocha | H01L 21/02236 |
| 10,529,812 B1 * | 1/2020 | Edwards | H01L 27/088 |
| 10,964,738 B2 * | 3/2021 | Chen | H04N 5/378 |
| 11,043,483 B2 * | 6/2021 | Hwang | H01L 27/0255 |
| 2002/0197810 A1 * | 12/2002 | Hanafi | H01L 29/66772 |
| | | | 438/330 |
| 2004/0048876 A1 * | 3/2004 | Busch | A61K 31/496 |
| | | | 514/254.04 |
| 2004/0150066 A1 * | 8/2004 | Inoue | H01L 21/823857 |
| | | | 257/500 |
| 2005/0029616 A1 * | 2/2005 | Noda | H01L 21/823418 |
| | | | 257/500 |
| 2006/0102928 A1 * | 5/2006 | Nakamura | H01L 21/82385 |
| | | | 257/147 |
| 2007/0164328 A1 * | 7/2007 | Nakamura | H01L 21/823857 |
| | | | 257/288 |
| 2008/0188048 A1 * | 8/2008 | Nagai | H01L 29/7831 |
| | | | 438/286 |
| 2009/0053885 A1 * | 2/2009 | Sakamoto | H01L 29/66833 |
| | | | 438/594 |
| 2009/0146220 A1 * | 6/2009 | Yoo | H01L 21/823462 |
| | | | 257/392 |
| 2010/0032732 A1 * | 2/2010 | Booth, Jr. | H01L 23/5252 |
| | | | 257/288 |
| 2010/0214008 A1 | 8/2010 | Li | |
| 2013/0039117 A1 | 2/2013 | Lin | |
| 2015/0061011 A1 * | 3/2015 | Cheng | H01L 29/42364 |
| | | | 257/344 |
| 2016/0027899 A1 * | 1/2016 | Kim | H01L 21/823462 |
| | | | 257/336 |
| 2016/0104542 A1 | 4/2016 | Wu | |
| 2017/0018612 A1 * | 1/2017 | Ito | H01L 29/0865 |
| 2017/0200650 A1 * | 7/2017 | Chang | H01L 29/0847 |
| 2017/0263766 A1 * | 9/2017 | Xia | H01L 21/31111 |
| 2017/0301406 A1 | 10/2017 | Wong | |
| 2018/0013421 A1 * | 1/2018 | Park | H03K 17/6871 |
| 2018/0158738 A1 * | 6/2018 | Chang | H01L 21/823462 |
| 2019/0019866 A1 * | 1/2019 | Kim | H01L 29/66659 |
| 2019/0027228 A1 | 1/2019 | Hsu | |
| 2020/0091285 A1 * | 3/2020 | Hafez | H01L 29/0638 |
| 2021/0020519 A1 * | 1/2021 | Wang | H01L 27/088 |

OTHER PUBLICATIONS

Chern, the specification, including the claims, and drawings in the U.S. Appl. No. 16/801,121, filed Feb. 25, 2020.

Chern, the specification, including the claims, and drawings in the U.S. Appl. No. 16/876,092, filed May 17, 2020.

Chern, the specification, including the claims, and drawings in the U.S. Appl. No. 16/856,055, filed Apr. 23, 2020.

* cited by examiner

MOS TRANSISTOR HAVING LOWER GATE-TO-SOURCE/DRAIN BREAKDOWN VOLTAGE AND ONE-TIME PROGRAMMABLE MEMORY DEVICE USING THE SAME

BACKGROUND OF THE INVENTION

1. Field of the Invention

The present disclosure relates generally to the field of semiconductor technology. More particularly, the present disclosure relates to a metal-oxide-semiconductor (MOS) transistor having lower gate-to-source/drain breakdown voltage and one-time programmable (OTP) memory devices using such MOS transistor.

2. Description of the Prior Art

As known in the art, non-volatile memory retains stored information even after power is removed from the non-volatile memory circuit. Some non-volatile memory designs permit reprogramming, while other designs only permit one-time programming. Thus, one form of non-volatile memory is a One-Time Programmable (OTP) memory.

An OTP memory may contain an antifuse. An antifuse functions oppositely to a fuse by initially being nonconductive. When programmed, the antifuse becomes conductive. To program an antifuse, a dielectric layer such as an oxide is subjected to a high electric field to cause dielectric breakdown or oxide rupture. After dielectric breakdown, a conductive path is formed through the dielectric and thereby makes the antifuse become conductive.

To read the memory cell, a current passing through the ruptured or unruptured oxide is typically required. However, some ruptured oxides could be in a soft breakdown condition. The leakage current of the oxide in soft breakdown condition could be small. Therefore, a complicate sensing amplifier is often needed to compare the source side and drain side gate oxide leakage currents.

SUMMARY OF THE INVENTION

It is one objective of the present disclosure to provide a MOS transistor having lower gate-to-source/drain breakdown voltage and OTP memory devices using such MOS transistor.

One aspect of the present disclosure provides a MOS transistor including a semiconductor substrate; a drain region and a source region in the semiconductor substrate; a channel region between the drain region and the source region; a gate electrode on the channel region; and a gate dielectric layer between the gate electrode and the semiconductor substrate, wherein the gate dielectric layer has different thicknesses, and wherein the MOS transistor has a gate-to-source/drain breakdown voltage that is lower than a gate-to-channel breakdown voltage and a gated source/drain junction breakdown voltage.

According to some embodiments, a first portion of the gate dielectric layer that is situated directly between the drain region and the gate electrode is thinner than a second portion of the gate dielectric layer that is situated directly between the channel region and the gate electrode.

According to some embodiments, a third portion of the gate dielectric layer that is situated directly between the source region and the gate electrode is thinner than the second portion of the gate dielectric layer that is situated directly between the channel region and the gate electrode.

According to some embodiments, the gate electrode comprises a main gate portion disposed directly above the channel region, and a first extension gate portion and a second extension gate portion disposed on two opposite sidewalls of the main gate portion, respectively.

According to some embodiments, the first extension gate portion of the gate electrode is situated directly on the first portion of the gate dielectric layer and the second extension gate portion of the gate electrode is situated directly on the third portion of the gate dielectric layer.

According to some embodiments, the first extension gate portion of the gate electrode is in direct contact with the first portion of the gate dielectric layer and the second extension gate portion of the gate electrode is in direct contact with the third portion of the gate dielectric layer.

According to some embodiments, the main gate portion, the first extension gate portion and the second extension gate portion of the gate electrode are composed of doped polysilicon, silicide, or metal.

According to some embodiments, the first extension gate portion of the gate electrode is covered with a first dielectric spacer and the second extension gate portion of the gate electrode is covered with a second dielectric spacer.

According to some embodiments, a first vertical PN junction, which is between the drain region and the channel region and is proximate to a top surface of the semiconductor substrate, is situated directly underneath the main gate portion of the gate electrode.

According to some embodiments, a second vertical PN junction, which is between the source region and the channel region and is proximate to the top surface of the semiconductor substrate, is situated directly underneath the main gate portion of the gate electrode.

Another aspect of the present disclosure pertains to a method for fabricating a metal-oxide-semiconductor (MOS) transistor. A semiconductor substrate having thereon a gate dielectric layer and a first conductive layer is provided. The first conductive layer is patterned into a main gate portion. An ion implantation process is performed to form a drain region and source region in the semiconductor substrate on two sides of the main gate portion, respectively. A channel region is formed between the drain region and the source region. By thinning down the gate dielectric layer after patterning the first conductive layer into the main gate portion, a first portion of the gate dielectric layer on the drain region, a second portion of the gate dielectric layer between the channel region and the main gate portion, and a third portion of the gate dielectric layer on the source region are formed. A first extension gate portion and a second extension gate portion are formed on two opposite sidewalls of the main gate portion, respectively, wherein the main gate portion, the first extension gate portion and the second extension gate portion constitute a gate electrode of the MOS transistor.

According to some embodiments, the method further includes: forming a first dielectric spacer and a second dielectric spacer on the first extension gate portion and the second extension gate portion, respectively.

According to some embodiments, the method further includes: forming a first salicide layer on the drain region and a second salicide layer on the source region.

According to some embodiments, the first portion and the third portion of the gate dielectric layer are thinner than the second portion of the gate dielectric layer.

According to some embodiments, the first extension gate portion of the gate electrode is situated directly on the first portion of the gate dielectric layer and the second extension gate portion of the gate electrode is situated directly on the third portion of the gate dielectric layer.

According to some embodiments, the first extension gate portion of the gate electrode is in direct contact with the first portion of the gate dielectric layer and the second extension gate portion of the gate electrode is in direct contact with the third portion of the gate dielectric layer.

According to some embodiments, a first vertical PN junction, which is between the drain region and the channel region and is proximate to a top surface of the semiconductor substrate, is situated directly underneath the main gate portion of the gate electrode.

According to some embodiments, a second vertical PN junction, which is between the source region and the channel region and is proximate to the top surface of the semiconductor substrate, is situated directly underneath the main gate portion of the gate electrode.

According to some embodiments, the MOS transistor has a gate-to-source/drain breakdown voltage that is lower than a gate-to-channel breakdown voltage and a gated source/drain junction breakdown voltage.

Another aspect of the present disclosure provides a one-time programmable (OTP) memory device comprising at least one MOS transistor, wherein the MOS transistor has a gate-to-source/drain breakdown voltage that is lower than a gate-to-channel breakdown voltage and a gated source/drain junction breakdown voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

DETAILED DESCRIPTION

Figure 1:
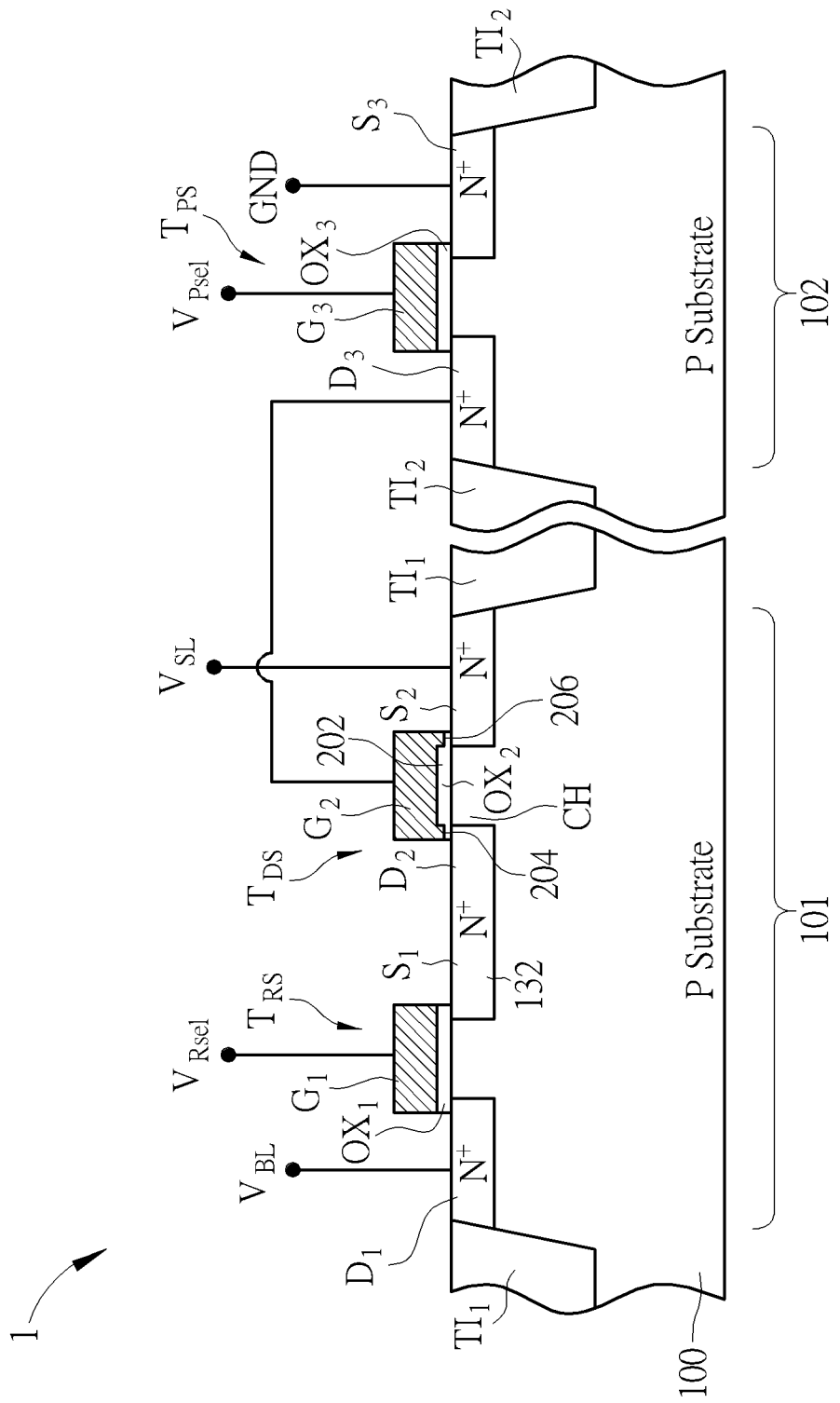
FIG. 1 is a cross section of a semiconductor memory cell in accordance with one embodiment of the invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

Embodiments are described herein with reference to cross-section illustrations that are schematic illustrations of idealized embodiments (and intermediate structures). Thus, these embodiments should not be construed as limited to the particular shapes of regions illustrated herein but are to include deviations in shapes. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

It will be appreciated that although some conductivity types have been used for illustrative purposes, the invention may be practiced with opposite conductivity types. For example, an NMOS transistor in one embodiment may be replaced with a PMOS transistor in another embodiment without departing from the spirit and scope of the invention.

The present invention pertains to a MOS transistor having lower gate-to-source/drain breakdown voltage and OTP memory devices using such MOS transistor. The OTP memory devices may comprise a plurality of three-transistor (3T) bit cell structures in the OTP memory array. The OTP memory array utilizes the channel current, instead of ruptured or unruptured dielectric leakage current, for read operations. This invention has a great advantage over the prior art because the state "1" bit current is the transistor "on" current that is consistently high without too much variation other than those caused by manufacture process fluctuation, while the state "0" bit current is the very small transistor "off" current.

One aspect of the invention provides a semiconductor device including at least an OTP unit cell. A programming path for programming the OTP unit cell is different from a reading path for reading the OTP unit cell. According to some embodiments, the OTP unit cell comprises a programmable MOS transistor that is electrically programmed to "1" state or "0" state. According to some embodiments, the programmable MOS transistor is programmed to the "1" state by rupturing a gate dielectric layer between a gate and a drain of the MOS transistor. According to some embodiments, the programmable MOS transistor is programmed to "0" state by rupturing the gate dielectric layer between the gate and a source of the MOS transistor. According to some embodiments, the gate of the programmable MOS transistor is switched between ground and floating by a switching MOS transistor.

FIG. 1 is a cross section of a semiconductor memory cell (or OTP unit cell) in accordance with one embodiment of the invention. According to one embodiment of the invention, the illustrated semiconductor memory cell may be a 3T bit cell structure that is included in an OTP memory array. As shown in FIG. 1, the semiconductor memory cell (or OTP unit cell) 1 comprises a read select transistor $T_{RS}$ that is in series connection with a data storage transistor $T_{DS}$ for storing a digit "1" or a digital "0" data. The read select transistor $T_{RS}$ and the data storage transistor $T_{DS}$ may be constructed on the first active area 101 that is isolated by a first trench isolation structure $TI_1$. The first active area 101 may be defined on a semiconductor substrate 100 having a first conductivity type, for example, P type. According to one embodiment, for example, the semiconductor substrate 100 may be a silicon substrate or a silicon-on-insulator (SOI) substrate, but not limited thereto.

The read select transistor $T_{RS}$ may be used to "select" a memory cell for reading. According to one embodiment of the invention, the read select transistor $T_{RS}$ comprises a first gate $G_1$, a first gate dielectric layer $OX_1$ between the first gate $G_1$ and the semiconductor substrate 100, a first drain region $D_1$ in the semiconductor substrate 100 on one side of the first gate $G_1$, and a first source region $S_1$ in the semiconductor substrate 100 on the other side of the first gate $G_1$. According to one embodiment of the invention, the read select transistor $T_{RS}$ may be an NMOS transistor, and the first drain region $D_1$ and the first source region $S_1$ may be $N^+$ doping regions. The first gate $G_1$ may be a single polysilicon (or single poly) layer or a metal gate.

According to one embodiment of the invention, the data storage transistor $T_{DS}$ comprises a second gate $G_2$, a second gate dielectric layer $OX_2$ between the second gate $G_2$ and the semiconductor substrate 100, a second drain region $D_2$ in the semiconductor substrate 100 on one side of the second gate $G_2$, a second source region $S_2$ in the semiconductor substrate 100 on the other side of the second gate $G_2$, and a channel region CH between the second drain region $D_2$ and the second source region $S_2$. According to one embodiment of the invention, the data storage transistor $T_{DS}$ may be an NMOS transistor, and the second drain region $D_2$ and the second source region $S_2$ may be $N^+$ doping regions. Likewise, the second gate $G_2$ may be a single polysilicon layer or a metal gate. Therefore, the read select transistor $T_{RS}$ and the data storage transistor $T_{DS}$ constitute two serially connected NMOS transistors on the first active area 101. The $N^+$ doping region 132 between the first gate $G_1$ and the second gate $G_2$ in the semiconductor substrate 100 is commonly shared by the read select transistor $T_{RS}$ and the data storage transistor $T_{DS}$.

According to one embodiment of the invention, the portions 204 and 206 of the second gate dielectric layer $OX_2$ that are situated directly between and the second gate $G_2$ and, respectively the second drain region $D_2$ and the second source region $S_2$ are thinner than the portion 202 of the second gate dielectric layer $OX_2$ that is situated directly between the channel region CH and the second gate $G_2$. Therefore, the second gate dielectric layer $OX_2$ has different thicknesses, thereby achieving a lower gate-to-source/drain breakdown voltage of the data storage transistor $T_{DS}$.

Figure 16:
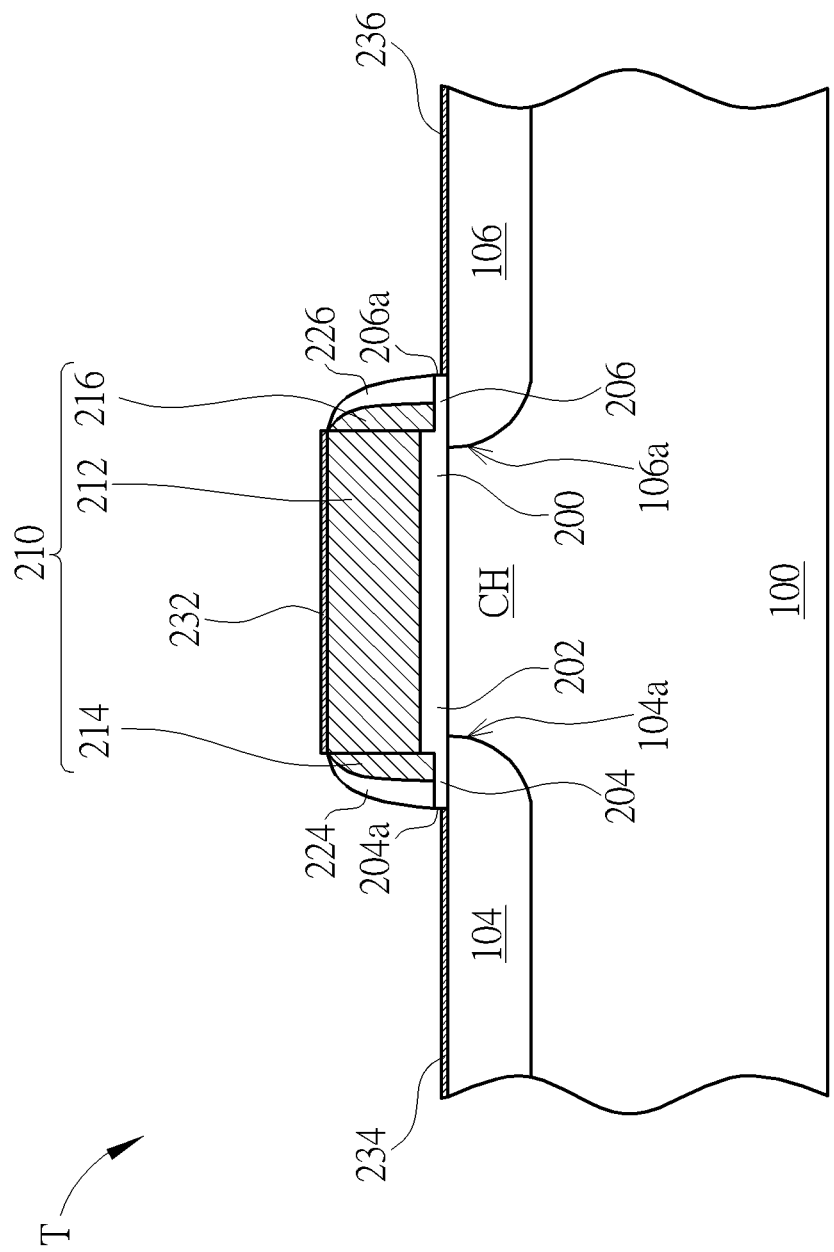

Please refer to FIG. 16 for the detailed MOS transistor structure. FIG. 16 is a cross section of an exemplary MOS transistor suited for the data storage transistor having lower gate-to-source/drain breakdown voltage according to one embodiment of the invention, wherein like layers, elements or regions are designated by like numeral numbers or labels. As shown in FIG. 16, the MOS transistor T comprises a semiconductor substrate 100, a drain region 104 and a source region 106 in the semiconductor substrate 100, a channel region CH between the drain region 104 and the source region 106, a gate electrode 210 disposed on the channel region CH, a gate dielectric layer 200 between the gate electrode 210 and the semiconductor substrate 100. The gate dielectric layer 200 has different thicknesses. According to one embodiment of the invention, the portions 204 and 206 of the gate dielectric layer 200 that are situated directly between the gate electrode 210 and, respectively, the drain region 104 and the source region 106 are thinner than the portion 202 of the gate dielectric layer 200 that is situated directly between the channel region CH and the gate electrode 210.

According to one embodiment of the invention, the gate electrode 210 comprises a main gate portion 212 disposed directly above the channel region CH and two extension gate portions 214 and 216 disposed on two opposite sidewalls of the main gate portion 212. The extension gate portion 214 of the gate electrode 210 is situated directly on the portion 204 of the gate dielectric layer 200 and the extension gate portion 216 of the gate electrode 210 is situated directly on the portion 206 of the gate dielectric layer 200. The extension gate portion 214 of the gate electrode 210 is in direct contact with the portion 204 of the gate dielectric layer 200 and the extension gate portion 216 of the gate electrode 210 is in direct contact with the portion 206 of the gate dielectric layer 200. According to one embodiment of the invention, the main gate portion 212, the extension gate portion 214, and the extension gate portion 216 of the gate electrode 210 may be composed of doped polysilicon, silicide, or metal, but is not limited thereto.

The outer surface of the extension gate portion 214 of the gate electrode 210 is covered with a dielectric spacer 224 and the outer surface of the extension gate portion 216 of the gate electrode 210 is covered with a dielectric spacer 226. According to one embodiment of the invention, for example, the dielectric spacers 224 and 226 may comprise silicon nitride, silicon oxynitride or silicon oxide, but is not limited thereto. According to one embodiment of the invention, an end surface 204a of the portion 204 may be aligned with an outer surface of the dielectric spacer 224 and an end surface 206a of the portion 206 may be aligned with an outer surface of the dielectric spacer 226. According to one embodiment of the invention, the dielectric spacer 224 may be situated on the portion 204 of the gate dielectric layer 200 and the dielectric spacer 226 may be situated on the portion 206 of the gate dielectric layer 200.

According to one embodiment of the invention, the MOS transistor T further comprises a self-aligned silicide (or salicide) layer 232 on the gate electrode 210, a salicide layer 234 on the drain region 104, and a salicide layer 236 on the source region 106. According to one embodiment of the invention, salicide layers 232, 234 and 236 may comprise NiSi, CoSi, TiSi, or WSi, but is not limited thereto. According to one embodiment of the invention, the salicide layer 234 is contiguous with the end surface 204a of the portion 204, and the salicide layer 236 is contiguous with the end surface 206a of the portion 206.

According to one embodiment of the invention, the vertical PN junctions 104a and 106a, which are proximate to the top surface of the semiconductor substrate 100 and are between the channel region CH and, respectively, the drain region 104 and the source region 106 are situated directly underneath the main gate portion 212 of the gate electrode 210. By providing such configuration, a higher gated source/drain junction breakdown voltage can be provided. According to one embodiment of the invention, the MOS transistor T has a gate-to-source/drain breakdown voltage that is lower than a gate-to-channel breakdown voltage and the gated source/drain junction breakdown voltage.

Adverting to FIG. 1, the semiconductor memory cell 1 further comprises a program select transistor $T_{PS}$ that is used to "select" a memory cell for programming. The program select transistor $T_{PS}$ is constructed on the second active area 102 that is isolated by a second trench isolation structure $TI_2$. The second active area 102 may be disposed in close proximately to the first active area 101. According to one embodiment of the invention, the program select transistor $T_{PS}$ comprises a third gate $G_3$, a third gate dielectric layer $OX_3$ between the third gate $G_3$ and the semiconductor substrate 100, a third drain region $D_3$ in the semiconductor substrate 100 on one side of the third gate $G_3$, and a third source region $S_3$ in the semiconductor substrate 100 on the other side of the third gate $G_3$. The third drain region $D_3$ is electrically coupled to the second gate $G_2$.

According to one embodiment of the invention, the program select transistor $T_{PS}$ may be an NMOS transistor, and the third drain region $D_3$ and the third source region $S_3$ may be $N^+$ doping regions. Likewise, the third gate $G_3$ may be a single polysilicon layer or a metal gate.

Figure 2:
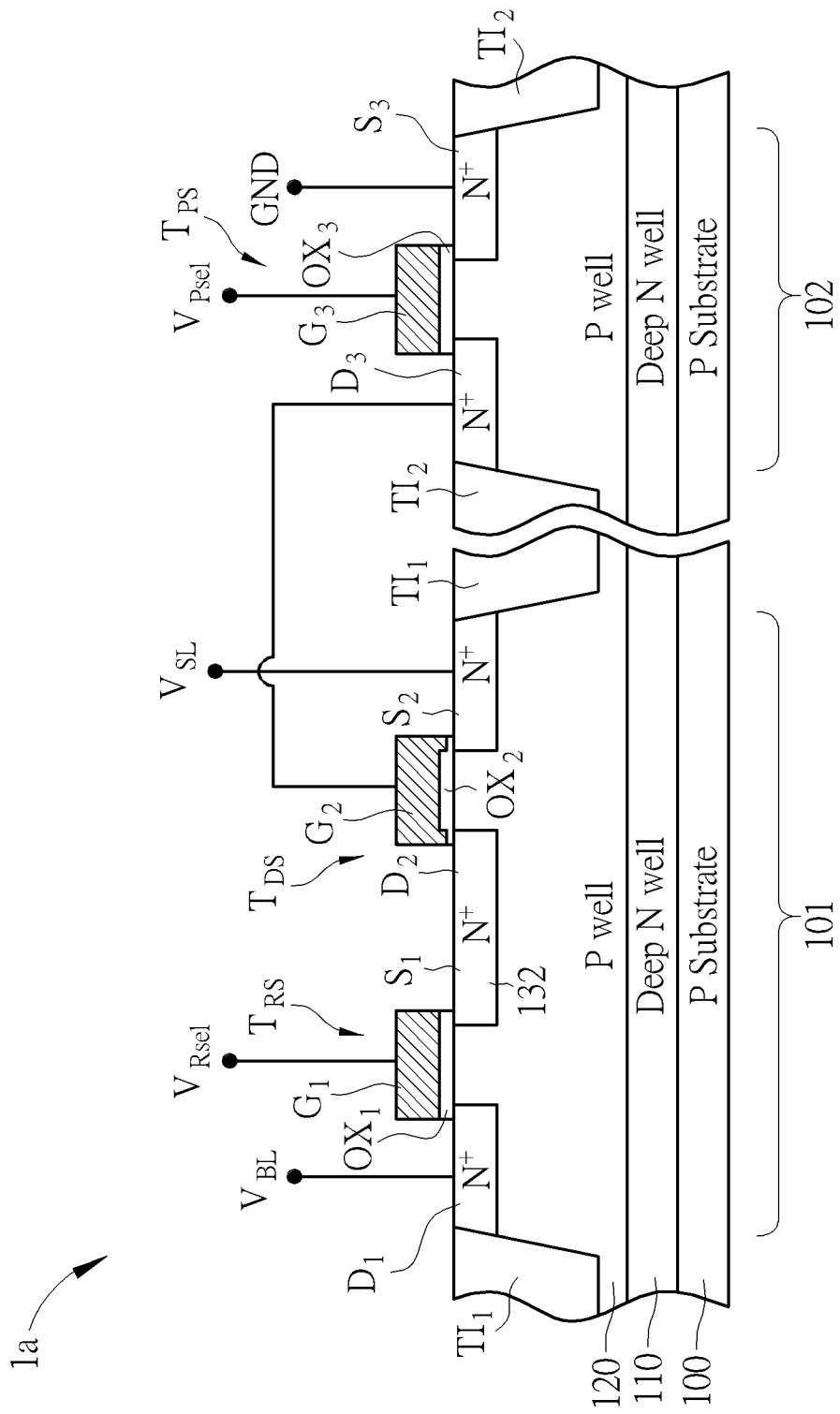
FIG. 2 is a cross section of a semiconductor memory cell in accordance with another embodiment of the invention, wherein a triple well is employed.

In another embodiment, as shown in FIG. 2, the semiconductor memory cell 1a comprising the read select transistor $T_{RS}$, the data storage transistor $T_{DS}$, and the program select transistor $T_{PS}$ may be constructed on a triple well structure comprising a deep N well 110 in the P type semiconductor substrate (P Substrate) 100 and a P well 120 isolated from the P type semiconductor substrate 100 by the deep N well 110. During program or read operations, the P well may be biased to a predetermined P well voltage through a P well pickup region (not shown in this figure). It is understood that the illustrated transistors in FIG. 1 and FIG. 2 may further comprise other elements such as spacers on sidewalls of the gates or lightly doped drain (LDD) regions merged with the heavily doped source/drain regions, which are not explicitly shown in the figures for the sake of simplicity.

According to one embodiment of the invention, during operation, the first drain region $D_1$ is electrically coupled to a bit line voltage $V_{BL}$, the first source region $S_1$ and the second drain region $D_2$ (i.e., the $N^+$ doping region 132) are electrically floating, the second source region $S_2$ is electrically coupled to a source line voltage $V_{SL}$, the third source region $S_3$ is electrically coupled to ground (GND), the first gate $G_1$ is electrically coupled to a read select voltage $V_{Rsel}$, and the third gate $G_3$ is electrically coupled to a program select voltage $V_{Psel}$.

Figure 3:
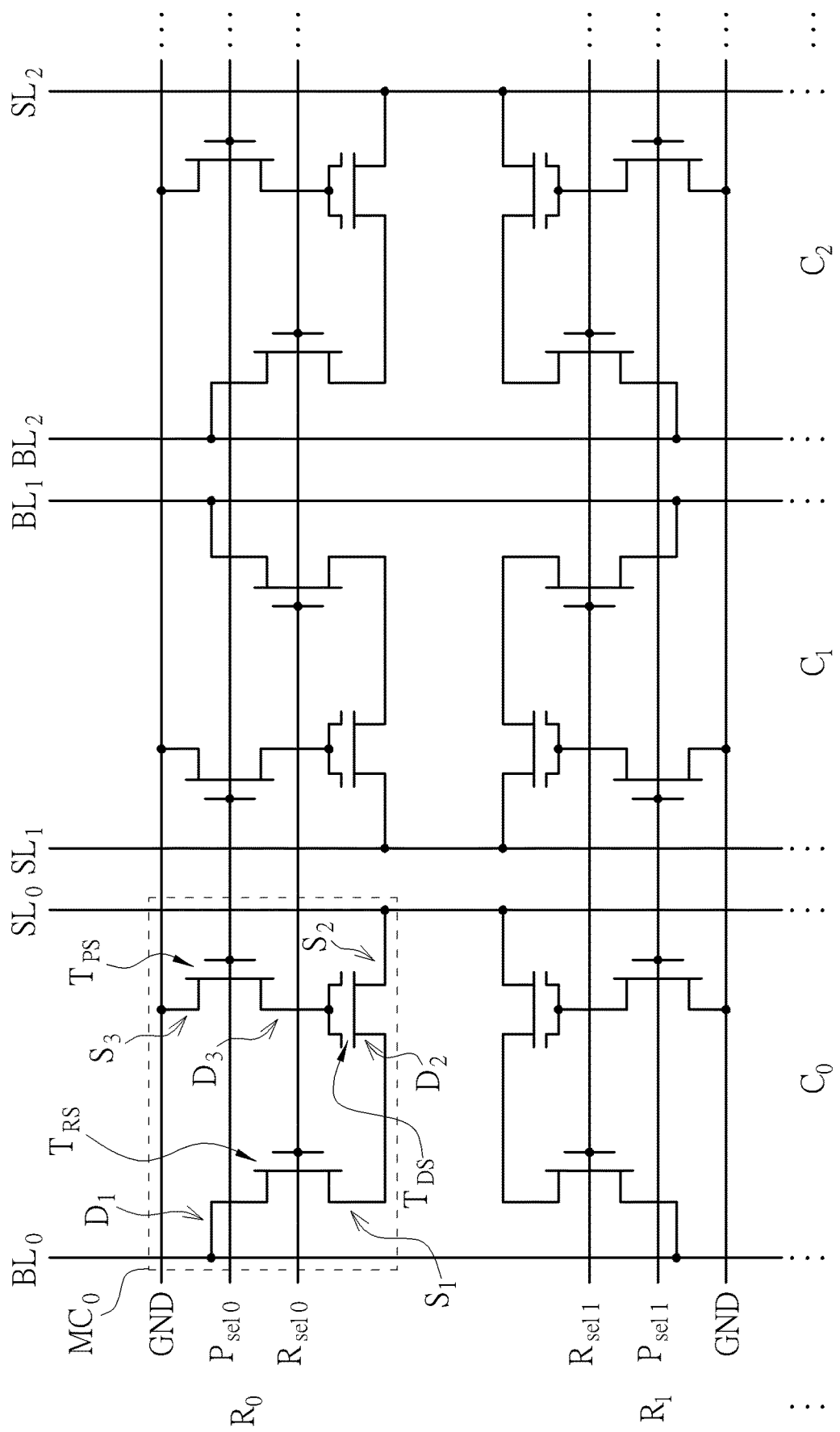
FIG. 3 is a schematic diagram showing an exemplary semiconductor memory array composed of the semiconductor memory cell as depicted in FIG. 1.

FIG. 3 is a diagram showing an exemplary semiconductor memory array composed of the semiconductor memory cell as depicted in FIG. 1. It is understood that although only a 2×3 cell array are shown in FIG. 3, the semiconductor memory array may be an arbitrary N by M array comprising memory cells arranged in N rows and M columns, where N and M are arbitrary numbers. For example, the memory cell $MC_0$ at the crosspoint of the row $R_0$ and the column $C_0$ comprises the read select transistor $T_{RS}$, the data storage transistor $T_{DS}$, and the program select transistor $T_{PS}$ as described in FIG. 1. The first drain region $D_1$ of the read select transistor $T_{RS}$ is electrically connected to a bit line $BL_0$, the second source region $S_2$ of the data storage transistor $T_{DS}$ is electrically connected to a source line $SL_0$, the first gate $G_1$ of the read select transistor $T_{RS}$ is electrically connected to a read select line $R_{sel0}$, and the third gate $G_3$ of the program select transistor $T_{PS}$ is electrically connected to a program select line $P_{sel0}$.

Figure 4:
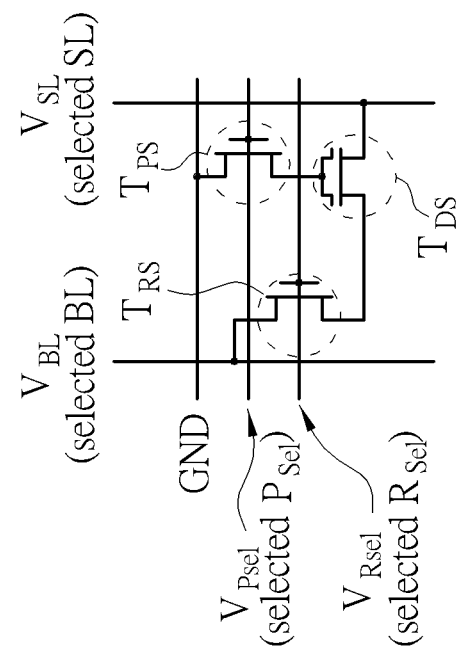
FIG. 4 shows the selected memory cell for the program "1" operation in the semiconductor memory array.
Figure 5:
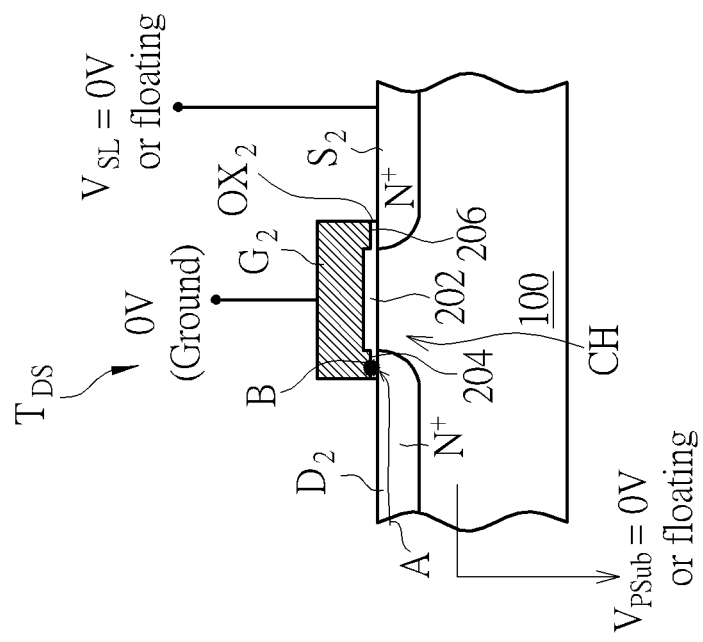
FIG. 5 is a cross section of the selected data storage transistor during the program "1" operation.

Please refer to Table 1 below, FIG. 4, FIG. 5, and briefly to FIG. 1 and FIG. 2. FIG. 4 shows the selected memory cell (or bit unit) of the semiconductor memory array. FIG. 5 is a cross section of the selected data storage transistor $T_{DS}$ during the program "1" operation. Table 1 shows exemplary bias conditions for programming digital "1" to the selected semiconductor memory cell in FIG. 4.

TABLE 1

| | Program "1" Condition |
|---|---|
| Terminal | Bias Voltage |
| Selected $P_{Sel}$, $V_{Psel}$ | 1-3 V |
| Unselected $P_{Sel}$ | 0 V |
| Selected $R_{Sel}$, $V_{Rsel}$ | 3-10 V |
| Selected BL, $V_{BL}$ | 3-10 V or Ramp up from 0 V till breakdown |
| Unselected BL | 0 V or Floating |
| $V_{SL}$ | 0 V or Floating |
| $V_{PW}$ | 0 V or Floating |
| $V_{PSub}/V_{DNW}$ | 0 V or Floating |

According to one embodiment of the invention, to program the selected bit unit to "1" state, the following bias conditions may be implemented:

(i) a program select voltage $V_{Psel}$ of about 1-3V is applied to the selected program select line $P_{sel}$ (selected $P_{sel}$) to turn on the program select transistor $T_{PS}$;

(ii) a high enough read select voltage $V_{Rsel}$ ranging between, for example, 3-10V may be applied to the selected read select line $R_{sel}$ (selected $R_{sel}$);

(iii) all the unselected program select lines $P_{sel}$ (unselected $P_{sel}$) and unselected read select lines $R_{sel}$ (unselected $R_{sel}$) are connected to ground GND (or 0V);

(iv) the semiconductor substrate 100 (e.g., P Substrate) is usually connected to ground ($V_{PSub}$=0V), and for the triple well structures as set forth in FIG. 2, the deep N well 110 is connected to ground ($V_{DNW}$=0V) while the P well 120 may be floating or connected to ground ($V_{PW}$=0V or floating);

(v) all the source lines SL and unselected bit lines BL are floating or connected to ground (0V); and (vi) the selected bit line voltage $V_{BL}$ is ramped up, preferred to be through a current limiter to prevent overloading the bit line voltage supply circuit, until a sudden increase in current A and a sudden drop in voltage across the second gate dielectric layer $OX_2$, indicating dielectric breakdown B, in FIG. 5, directly above the second drain region $D_2$ of the selected data storage transistor $T_{DS}$.

Alternatively, the dielectric breakdown B may be caused by simply applying a pre-set bit line voltage $V_{BL}$ that is higher than gate dielectric breakdown voltage (i.e., portion 204 $OX_2$ breakdown voltage), to the selected bit line, which is also preferred to be done through a current limiter to prevent overloading the bit line voltage supply circuit.

It is one technical feature of the invention that to write digital "1", only the thinner portion 204 of the second gate dielectric layer $OX_2$ that is adjacent to the second drain region $D_2$ (i.e. drain side dielectric) is ruptured, while the portion 206 of the second gate dielectric layer $OX_2$ that is adjacent to the second source region $S_2$ (i.e. source side dielectric) and the portion 202 directly over the channel region CH (i.e. channel dielectric) are remained intact.

Preferably, the data storage transistor $T_{DS}$ may have source junction breakdown voltage and drain junction breakdown voltage, which are higher than the gate dielectric breakdown voltage of the data storage transistor. However, this is not necessary for the embodiments with triple well structures as described in FIG. 2. Further, the gate dielectric breakdown voltage and the junction breakdown voltage of the read select transistor $T_{RS}$ are both higher than the gate dielectric breakdown voltage of the data storage transistor $T_{DS}$. This can be achieved by using thicker gate dielectric or cascoding two transistors for the read select transistor $T_{RS}$.

Figure 7:
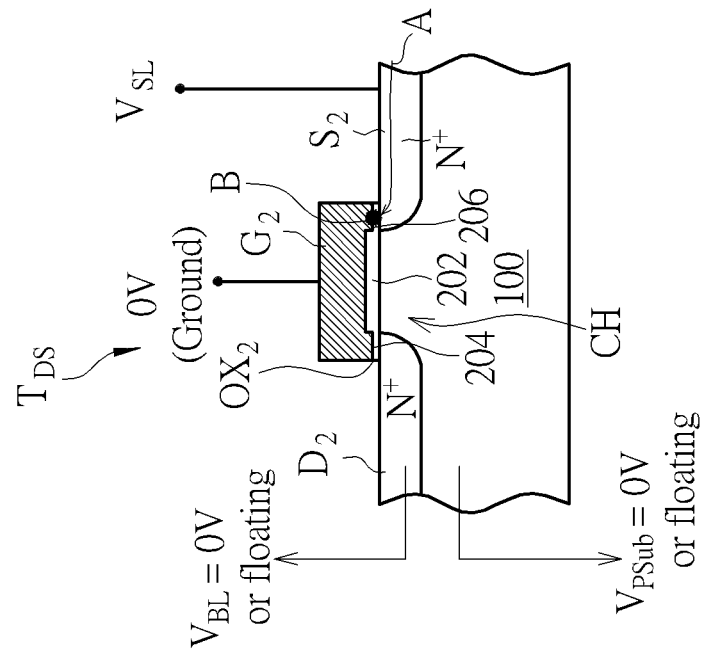
FIG. 7 is a cross section of the selected data storage transistor during the program "0" operation.
Figure 6:
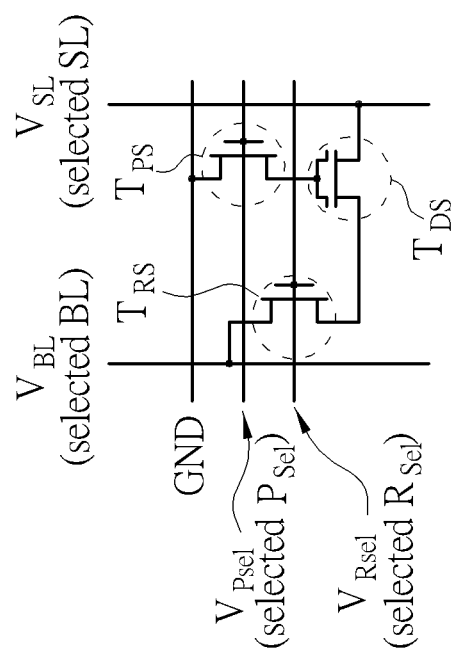
FIG. 6 shows the selected memory cell for the program "0" operation in the semiconductor memory array.

Please refer to Table 2 below, FIG. 6, FIG. 7, and briefly to FIG. 1 and FIG. 2. FIG. 6 shows the selected memory cell (or bit unit) in the semiconductor memory array. FIG. 7 is a cross section of the selected data storage transistor $T_{Ds}$ during the program "0" operation. Table 2 shows exemplary bias conditions for programming digital "0" to the selected semiconductor memory cell in FIG. 6.

TABLE 2

Program "0" Condition

| Terminal | Bias Voltage |
|---|---|
| Selected $P_{Sel}$, $V_{Psel}$ | 1-3 V |
| All $R_{Sel}$ | 0 V or don't care |
| Unselected $P_{Sel}$, | 0 V |
| Selected SL, $V_{SL}$ | 3-10 V or Ramp up from 0 V till breakdown |
| Unselected SL | 0 V or Floating |
| All BL, $V_{BL}$ | 0 V or Floating |
| P-Well, $V_{PW}$ | 0 V or Floating |
| Others, $V_{PSub}/V_{DNW}$ | 0 V or Floating |

According to one embodiment of the invention, to program the selected bit unit to "0" state, the following bias conditions may be implemented:

(i) a program select voltage $V_{Psel}$ of about 1-3V is applied to the selected program select line $P_{sel}$ (selected $P_{sel}$) to turn on the program select transistor $T_{PS}$;

(ii) all the unselected program select lines $P_{sel}$ (unselected $P_{sel}$) are connected to ground (or 0V);

(iii) all the read select lines $R_{sel}$ are connected to 0V or don't care;

(iv) the semiconductor substrate 100 (e.g., P Substrate) is usually connected to ground (0V), and for the triple well structures as set forth in FIG. 2, the deep N well 110 is connected to ground ($V_{DNW}$=0V) while the P well 120 may be floating or connected to ground ($V_{PW}$=0V or floating);

(v) all the bit lines BL and unselected source lines SL are floating or connected to ground; and (vi) the selected source line voltage $V_{SL}$ is ramped up, preferred to be through a current limiter to prevent overloading the source line voltage supply circuit, until a sudden increase in current A and a sudden drop in voltage across the second gate dielectric layer $OX_2$, indicating dielectric breakdown B, in FIG. 7, directly on the second source region $S_2$ of the selected data storage transistor $T_{DS}$.

Alternatively, the dielectric breakdown B may be caused by simply applying a pre-set source line voltage $V_{SL}$ that is higher than gate dielectric breakdown voltage (i.e., portion 206 of $OX_2$ breakdown voltage), to the selected source line, which is also preferred to be through a current limiter to prevent overloading the source line voltage supply circuit.

It is another technical feature of the invention that to write digital "0", only the portion 206 of the second gate dielectric layer $OX_2$ that is adjacent to the second source region $S_2$ (i.e. source side dielectric) is ruptured, while the portion 204 of the second gate dielectric layer $OX_2$ that is adjacent to the second drain region $D_2$ (i.e. drain side dielectric) and the portion 202 directly over the channel region CH (i.e. channel dielectric) are remained intact.

Figure 9:
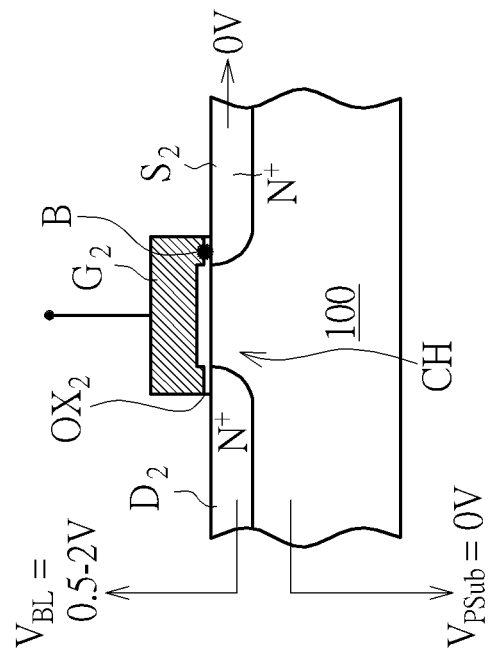
FIG. 9 is a cross section of the data storage transistor with "0" state during read operation.
Figure 8:
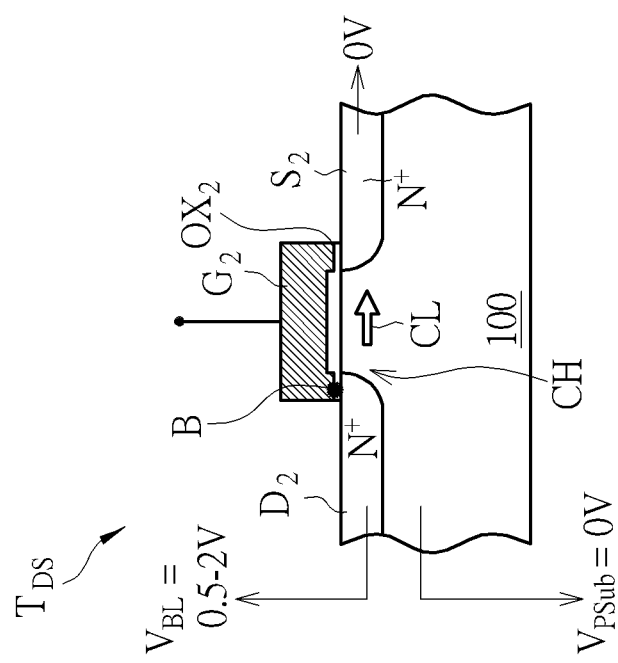
FIG. 8 is a cross section of the data storage transistor with "1" state during read operation.

Please refer to Table 3 below, FIG. 8 and FIG. 9. FIG. 8 is a cross section of the data storage transistor $T_{DS}$ with "1" state during read operation. FIG. 9 is a cross section of the data storage transistor $T_{DS}$ with "0" state during read operation. Table 3 shows exemplary bias conditions for reading data storage transistor $T_{DS}$.

To read a memory cell, the following exemplary bias conditions may be implemented:

(i) all the program select lines $P_{sel}$ are connected to ground (0V) to turn off all program select transistors $T_{PS}$ so that all the second gates $G_2$ of the data storage transistors $T_{DS}$ are isolated from the outside bias. Therefore, voltage of the second gate $G_2$ of the data storage transistors $T_{DS}$ is the same as that of second drain region $D_2$ if the dielectric breakdown B, caused during the programming procedure, is on the drain side, and the same as that of second source region $S_2$ if the dielectric breakdown B is on the source side;

(ii) a read select voltage $V_{Rsel}$ of about 1-3V is applied to the selected read select lines $R_{sel}$ so that drain of the selected data storage transistors $T_{DS}$ is connected to the selected bit line BL to which a bit line voltage $V_{BL}$ of 0.5-2V is applied; and (iii) all the other terminals are connected to ground (0V).

TABLE 3

Read Bias Condition

| Terminal | Bias Voltage |
|---|---|
| All $P_{Sel}$ | 0 V |
| Selected $R_{Sel}$ | 1-3 V |
| Unselected $R_{Sel}$, | 0 V |
| Selected BL | 0.5-2 V |
| Unselected BL | 0 V or Floating |
| All SL | 0 V |
| P-Well | 0 V |
| Others | 0 V |

Under the aforesaid read bias conditions, the data storage transistors $T_{DS}$ has a high channel current CL if the dielectric breakdown B is on the drain side because the gate voltage is high, same as the voltage applied to the second drain region $D_2$, and the data storage transistors $T_{DS}$ ("1" state) is turned on, as shown in FIG. 8. On the other hand, for the data storage transistors $T_{DS}$ in "0" state, there is no channel current (or only an insignificant amount of off-current) because the voltage coupled to the second gate $G_2$ is low, same as the voltage applied to the second source region $S_2$, and the data storage transistors $T_{DS}$ ("0" state) is turned off, as shown in FIG. 9. Therefore, the read current path is not through the ruptured dielectric, but is through the channel region CH of the data storage transistor $T_{DS}$.

According to some embodiments, all the isolated second gates $G_2$ of the data storage transistors $T_{DS}$ may be precharged by turning on all read select transistors $T_R$ simultaneously and applying 0.5-2V to all bit lines and 0V to all source line for a short period of time (e.g., 3 ms) prior to reading the entire OTP memory array. This can prevent those soft breakdown bits from errors due to slow charging.

FIG. 10 to FIG. 17 are schematic diagrams showing an exemplary method for fabricating a MOS transistor having lower gate-to-source/drain breakdown voltage according to one embodiment of the invention, wherein like layers, elements or regions are designated by like numeral numbers or labels.

Figure 10:
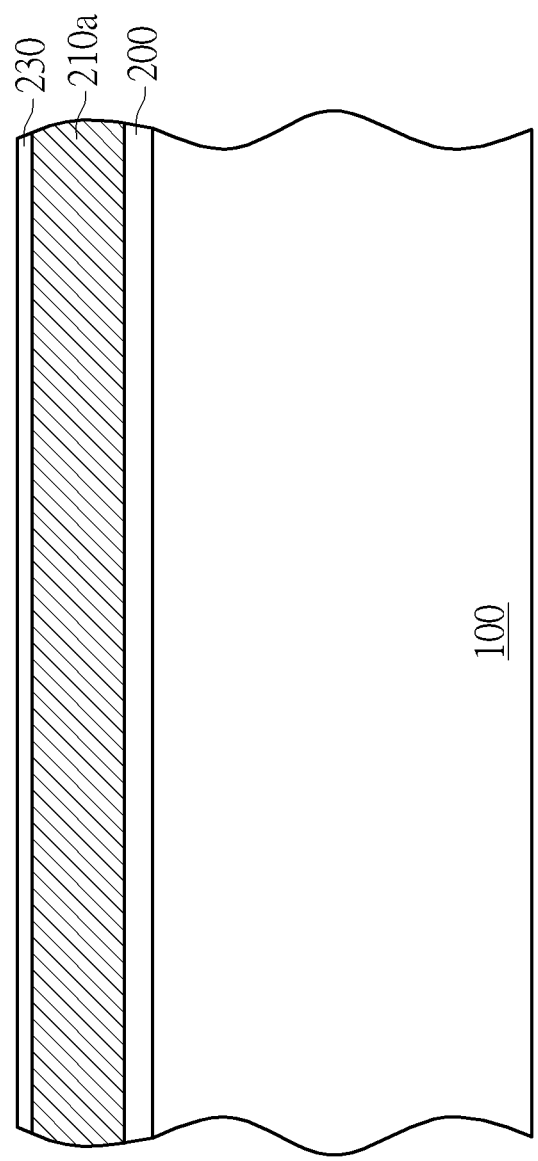
FIG. 10 to FIG. 17 are schematic diagrams showing an exemplary method for fabricating a MOS transistor having lower gate-to-source/drain breakdown voltage according to one embodiment of the invention.

As shown in FIG. 10, a semiconductor substrate 100 such as a P type silicon substrate is provided. A gate dielectric layer 200 such as silicon dioxide ($SiO_2$), silicon oxynitride (SiON) or hafnium dioxide ($HfO_2$), or the combination of two or more is deposited on the semiconductor substrate 100. According to one embodiment, the gate dielectric layer 200 may have a thickness of about 2-20 nm, but is not limited thereto. A first conductive layer 210a such as N-doped polysilicon, silicide or metal is then deposited on the gate dielectric layer 200. For example, the first conductive layer 210a is an N-doped polysilicon layer. According to one embodiment, the first conductive layer 210a may have a thickness of about 80-200 nm, but is not limited thereto. Optionally, a cap nitride layer 230 may be deposited on the first conductive layer 210a. For example, the cap nitride layer 230 may be a silicon nitride layer and may have a thickness of about 5-10 nm.

It will be appreciated that although some conductivity types have been used for illustrative purposes, the invention may be practiced with opposite conductivity types.

Figure 11:
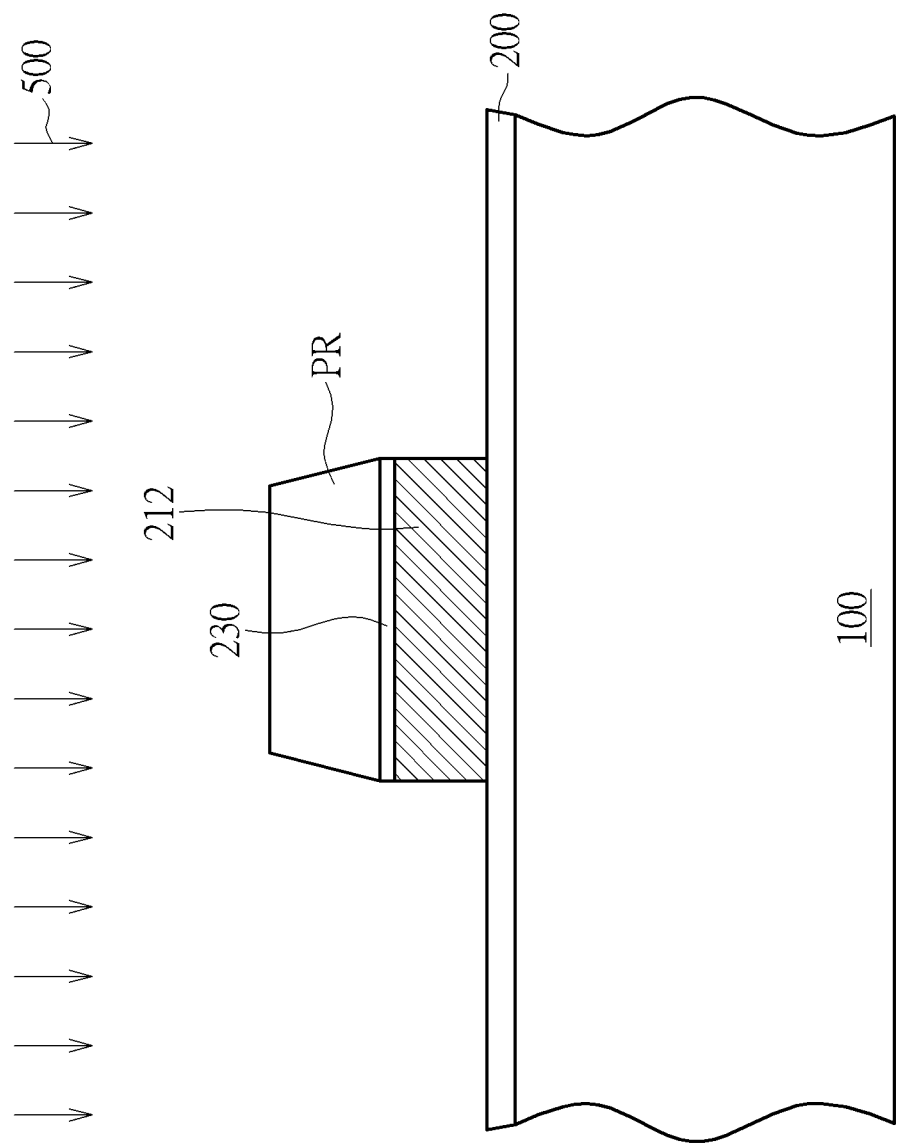

Subsequently, as shown in FIG. 11, a photoresist pattern PR is formed on the cap nitride layer 230 to define gate area. An anisotropic etching process 500 is then performed to remove the cap nitride layer 230 and the first conductive layer 210a not covered by the photoresist pattern PR, thereby forming a main gate portion 212. At this point, the gate dielectric layer 200 is substantially not etched.

Figure 12:
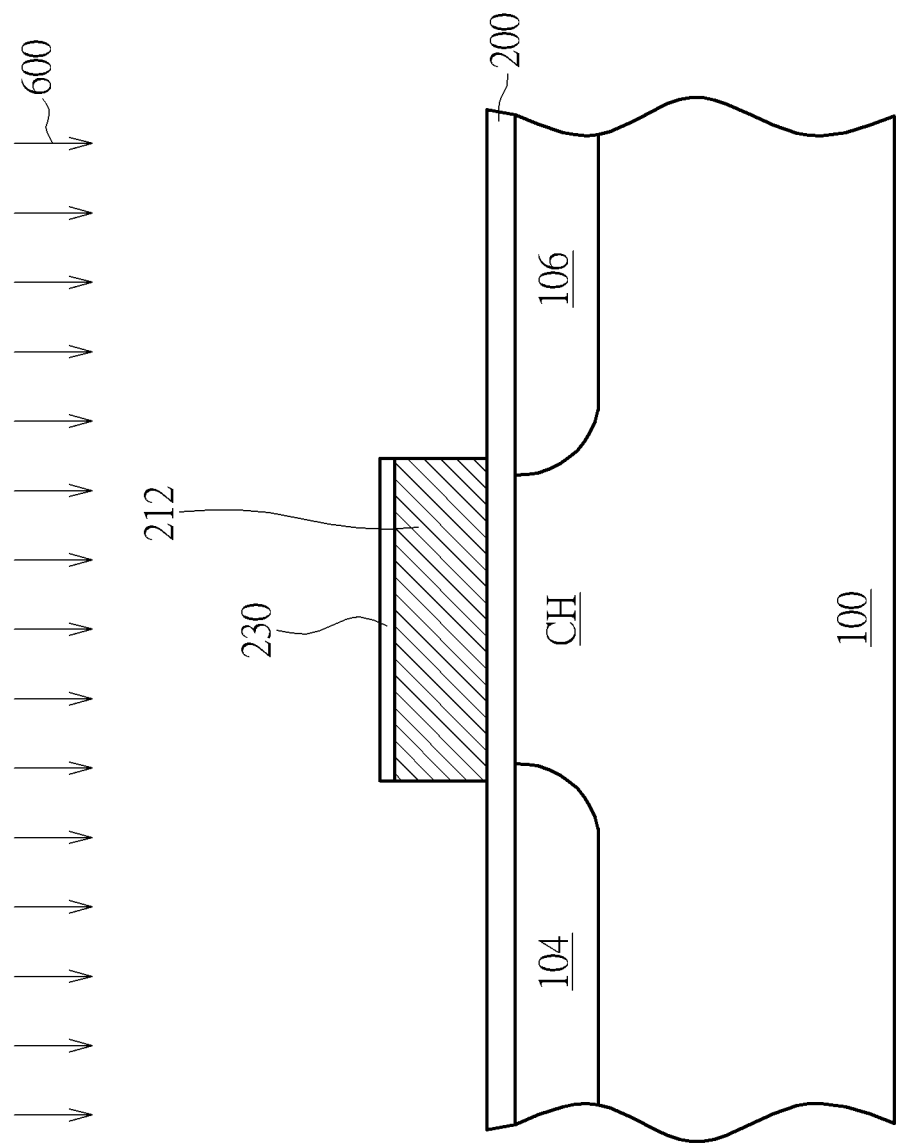

As shown in FIG. 12, the remaining photoresist pattern PR is removed. An ion implantation process 600 is then performed to implant N type dopants into the semiconductor substrate 100, thereby forming $N^+$ drain region 104 and $N^+$ source region 106. According to one embodiment, the $N^+$ drain region 104 and $N^+$ source region 106 may be formed with graded junction, which may be formed by using, for example, doubly diffused method, for higher junction breakdown voltage.

Figure 13:
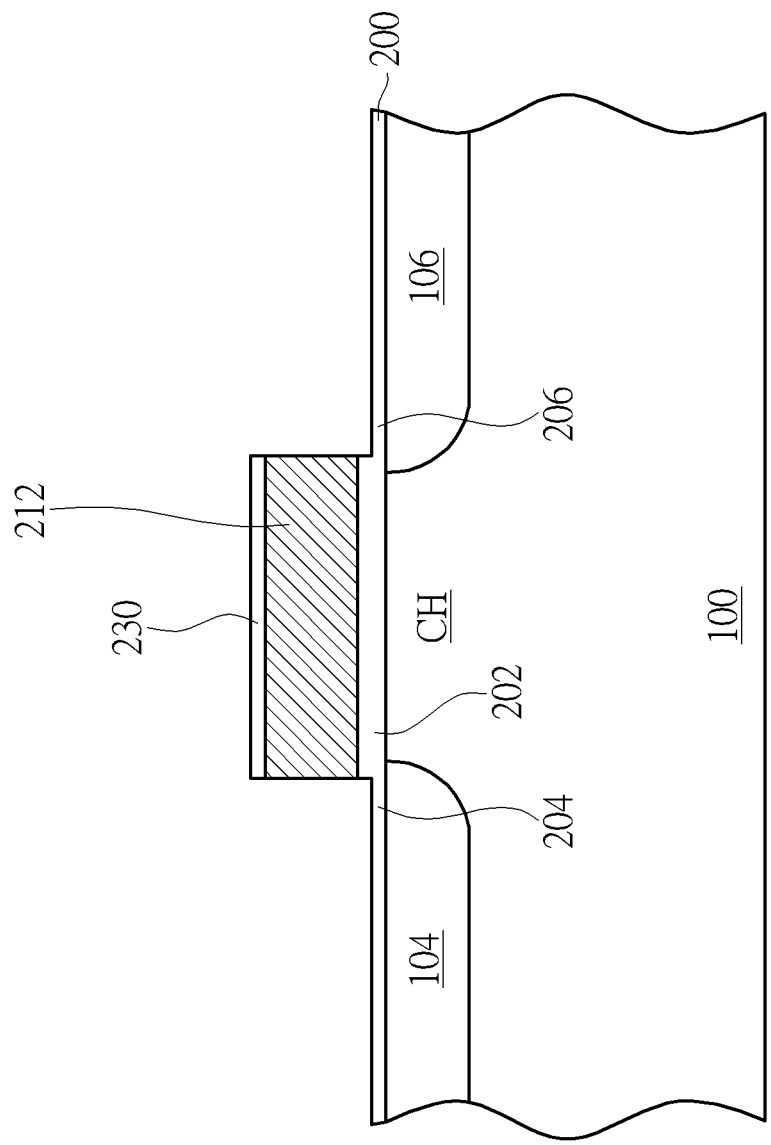

As shown in FIG. 13, an etching process is performed to remove an upper portion of the gate dielectric layer 200, thereby forming a thinner portions 204 and 206 on the $N^+$ drain region 104 and $N^+$ source region 106, respectively. The portions 204 and 206 may be thinned down to thickness of 30-70% of the original thickness. According to one embodiment, the etching process may be a wet etching process, but is not limited thereto. It is understood that in some embodiments the ion implantation process 600 in FIG. 12 may be performed after gate dielectric thinning down.

Figure 14:
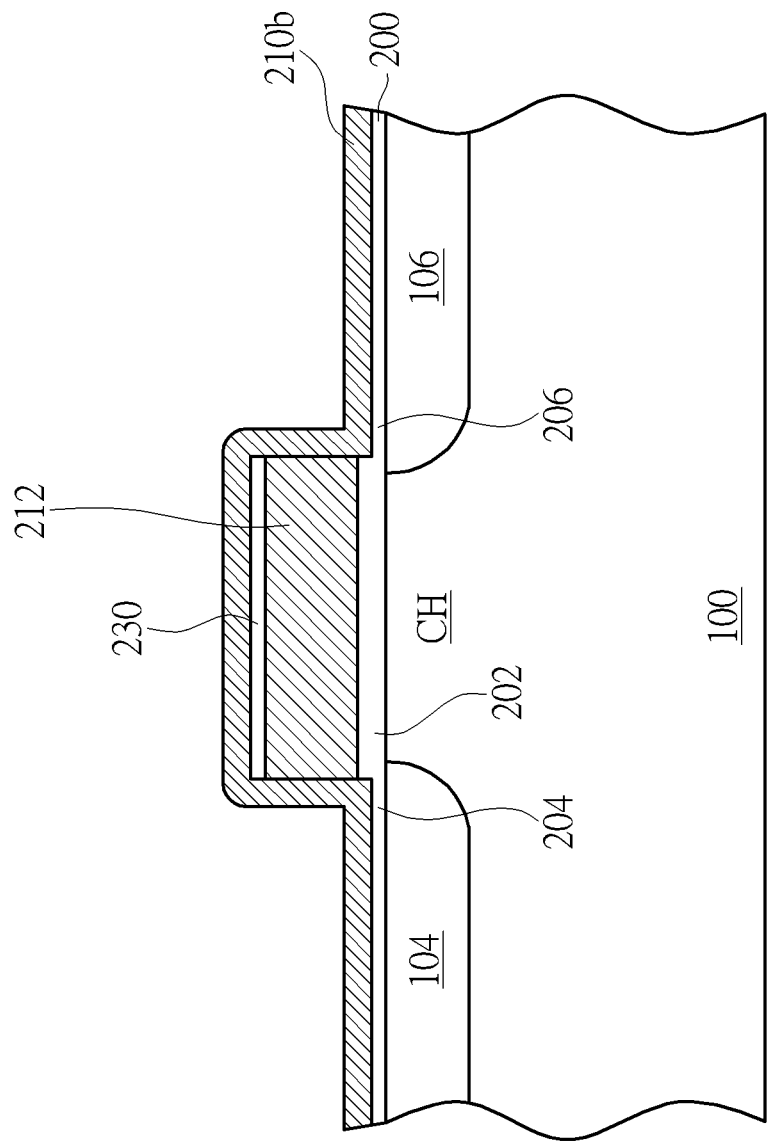
Figure 15:
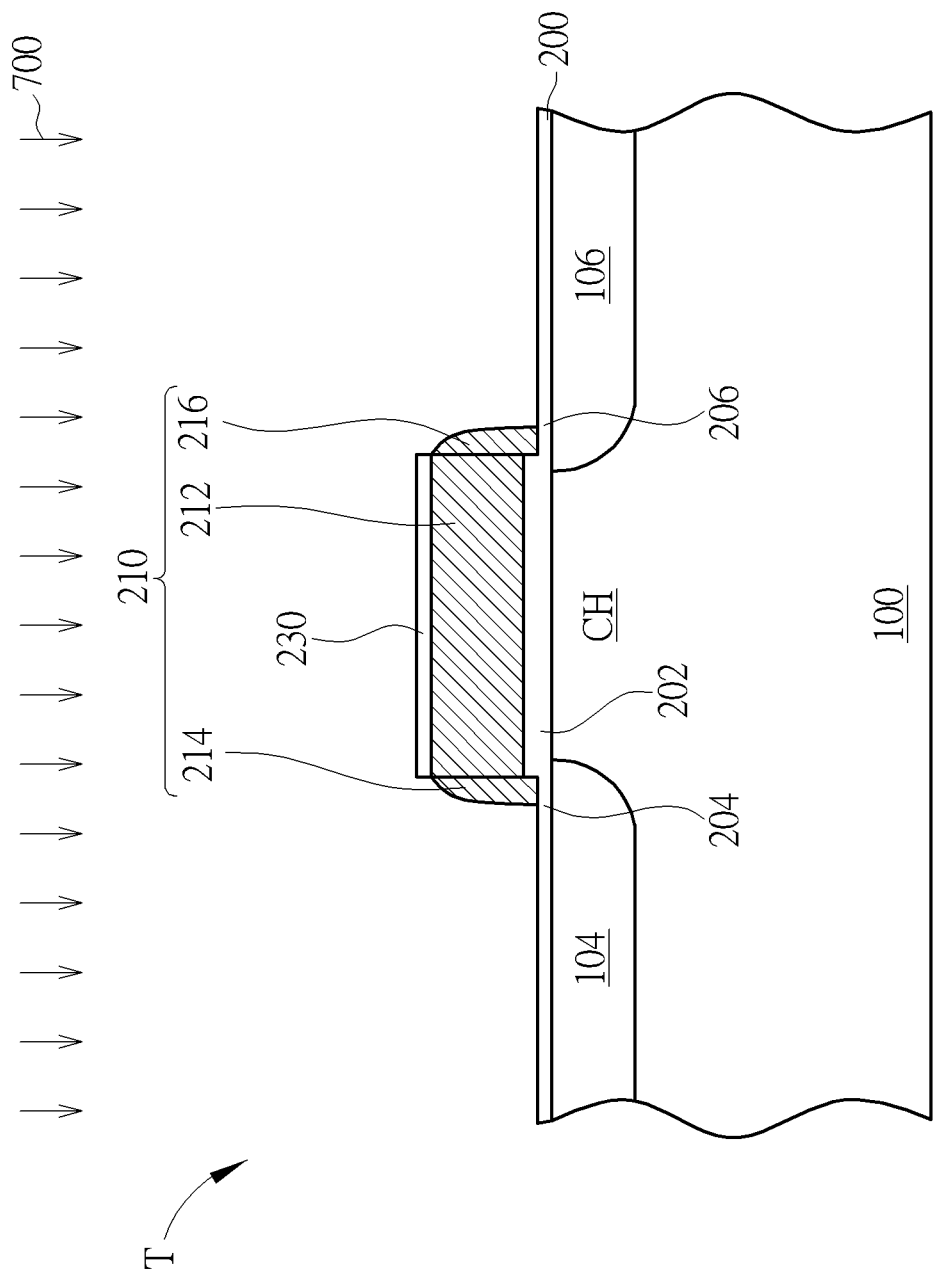

As shown in FIG. 14, a second conductive layer 210b such as N-doped polysilicon, silicide or metal is deposited on the semiconductor substrate 100. The second conductive layer 210b conformally covers the main gate portion 212 and the thinner portions 204 and 206. The second conductive layer 210b is in direct contact with the sidewalls of the main gate portion 212. For example, the second conductive layer 210b is an N-doped polysilicon layer. According to one embodiment, the second conductive layer 210b may have a thickness of about 20-100 nm, As shown in FIG. 15, an anisotropic etching process 700 is then performed to etch the second conductive layer 210b, thereby forming extension gate portions 214 and 216 on the opposite sidewalls of the main gate portion 212. The extension gate portion 214 is situated directly on the portion 204 of the gate dielectric layer 200 and the extension gate portion 216 of the gate electrode 210 is situated directly on the portion 206 of the gate dielectric layer 200.

As shown in FIG. 16, the cap nitride layer 230 is removed, optionally. After the removal of the cap nitride layer 230, the top surface of the main gate portion 212 is revealed. Subsequently, a dielectric spacer 224 and a dielectric spacer 226 are formed on the gate dielectric layer 200 and the extension gate portions 214 and 216 of the gate electrode 210, respectively. Removal of cap nitride layer 230 can also be achieved during formation of spacer 224 and spacer 226. The formation of the dielectric spacers 224 and 226 may involve conformal deposition of a spacer material layer and anisotropic etch of the spacer material layer. In some embodiments, the cap nitride layer 230 is not removed prior to the conformal deposition of the spacer material layer, and the cap nitride layer 230 can be removed during anisotropic etch of the spacer material layer.

The outer surface of the extension gate portion 214 of the gate electrode 210 is covered with the dielectric spacer 224 and the outer surface of the extension gate portion 216 of the gate electrode 210 is covered with the dielectric spacer 226. According to one embodiment of the invention, for example, the dielectric spacers 224 and 226 may comprise silicon nitride, silicon oxynitride or silicon oxide, but is not limited thereto. According to one embodiment of the invention, an end surface 204a of the portion 204 is aligned with an outer surface of the dielectric spacer 224 and an end surface 206a of the portion 206 is aligned with an outer surface of the dielectric spacer 226.

A self-aligned silicidation process is then performed to form a salicide layer 232 on the gate electrode 210, a salicide layer 234 on the drain region 104, and a salicide layer 236 on the source region 106. According to one embodiment of the invention, salicide layers 232, 234 and 236 may comprise NiSi, CoSi, TiSi, or WSi, but is not limited thereto. According to one embodiment of the invention, the salicide layer 234 is contiguous with the end surface 204a of the portion 204, and the salicide layer 236 is contiguous with the end surface 206a of the portion 206. According to one embodiment of the invention, the salicide layer 234 is not in direct contact with the dielectric spacer 224, and salicide layer 236 is not in direct contact with the dielectric spacer 226.

According to one embodiment of the invention, the vertical PN junctions 104a and 106a proximate to the top surface of the semiconductor substrate 100 are situated directly underneath the main gate portion 212 of the gate electrode 210. By providing such configuration, a higher gated source/drain junction breakdown voltage can be provided. According to one embodiment of the invention, the MOS transistor T has a gate-to-source/drain breakdown voltage that is lower than a gate-to-channel breakdown voltage and the gated source/drain junction breakdown voltage.

Figure 17:
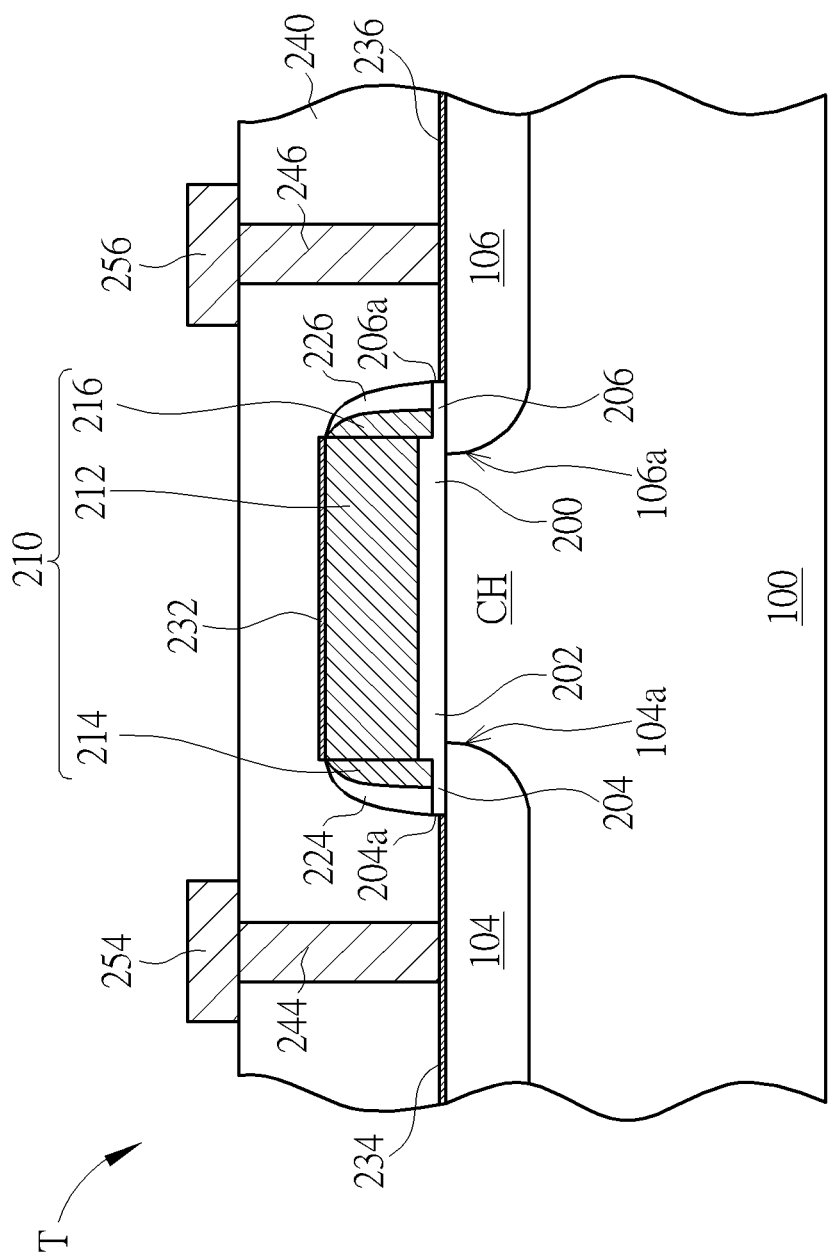

As shown in FIG. 17, an interlayer dielectric (ILD) layer 240 is then deposited on the semiconductor substrate 100. The ILD layer 240 covers the MOS transistor T. Subsequently, a contact plug 244 and a contact plug 246 may be formed in the ILD layer 240. An interconnect structure 254 and an interconnect structure 256 may be formed on the ILD layer 240. The interconnect structure 254 is electrically connected to the drain region 104 through the contact plug 244. The interconnect structure 256 is electrically connected to the source region 106 through the contact plug 246.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide-semiconductor (MOS) transistor, comprising:
   a semiconductor substrate;
   a drain region and a source region in the semiconductor substrate;
   a channel region between the drain region and the source region;

a gate electrode on the channel region, wherein the gate electrode comprises a main gate portion disposed directly above the channel region, and an extension gate portion on a sidewall of the main gate portion;

a gate dielectric layer between the gate electrode and the semiconductor substrate, wherein the gate dielectric layer has different thicknesses, wherein the extension gate portion of the gate electrode is situated directly on a thinner portion of the gate dielectric layer and the main gate portion of the gate electrode is situated directly on a thicker portion of the gate dielectric layer; and a dielectric spacer covering the extension gate portion of the gate electrode, wherein the dielectric spacer is situated directly on the thinner portion of the gate dielectric layer.

2. The MOS transistor according to claim 1, wherein a first portion of the gate dielectric layer that is situated directly between the drain region and the gate electrode is thinner than a second portion of the gate dielectric layer that is situated directly between the channel region and the gate electrode.

3. The MOS transistor according to claim 2, wherein a third portion of the gate dielectric layer that is situated directly between the source region and the gate electrode is thinner than the second portion of the gate dielectric layer that is situated directly between the channel region and the gate electrode.

4. The MOS transistor according to claim 3, wherein the gate electrode comprises a main gate portion disposed directly above the channel region, and a first extension gate portion and a second extension gate portion disposed on two opposite sidewalls of the main gate portion, respectively.

5. The MOS transistor according to claim 4, wherein the first extension gate portion of the gate electrode is situated directly on the first portion of the gate dielectric layer and the second extension gate portion of the gate electrode is situated directly on the third portion of the gate dielectric layer.

6. The MOS transistor according to claim 5, wherein the first extension gate portion of the gate electrode is in direct contact with the first portion of the gate dielectric layer and the second extension gate portion of the gate electrode is in direct contact with the third portion of the gate dielectric layer.

7. The MOS transistor according to claim 4, wherein the main gate portion, the first extension gate portion and the second extension gate portion of the gate electrode are composed of doped polysilicon, silicide, or metal.

8. The MOS transistor according to claim 4, wherein the first extension gate portion of the gate electrode is covered with a first dielectric spacer and the second extension gate portion of the gate electrode is covered with a second dielectric spacer.

9. The MOS transistor according to claim 4, wherein a first vertical PN junction, which is between the drain region and the channel region and is proximate to a top surface of the semiconductor substrate, is situated directly underneath the main gate portion of the gate electrode.

10. The MOS transistor according to claim 9, wherein a second vertical PN junction, which is between the source region and the channel region and is proximate to the top surface of the semiconductor substrate, is situated directly underneath the main gate portion of the gate electrode.

* * * * *